United States Patent
Jangity (10) Patent No.: US 9,385,696 B1
(45) Date of Patent: Jul. 5, 2016

(54) GENERATING A PULSE CLOCK SIGNAL BASED ON A FIRST CLOCK SIGNAL AND A SECOND CLOCK SIGNAL

(71) Applicant: APPLIED MICRO CIRCUITS CORPORATION, Sunnyvale, CA (US)

(72) Inventor: Arun Jangity, Sunnyvale, CA (US)

(73) Assignee: APPLIED MICRO CIRCUITS CORPORATION, Santa Clara, CA (US)

( * ) Notice: Subject to any disclaimer, the term of this patent is extended or adjusted under 35 U.S.C. 154(b) by 0 days.

(21) Appl. No.: 14/497,629

(22) Filed: Sep. 26, 2014

(51) Int. Cl.
*G06F 1/04* (2006.01)
*H03K 3/017* (2006.01)
*H03K 5/05* (2006.01)
*H03K 3/037* (2006.01)

(52) U.S. Cl.
CPC . *H03K 5/05* (2013.01); *H03K 3/037* (2013.01)

(58) Field of Classification Search
USPC ......... 327/199, 200, 212–213, 291, 293, 295, 327/298–299; 365/189.05, 189.17
See application file for complete search history.

(56) References Cited

U.S. PATENT DOCUMENTS

| | | | |
|---|---|---|---|
| 5,629,898 A | 5/1997 | Idei et al. | |
| RE38,903 E | 11/2005 | Wright et al. | |
| 6,975,145 B1 * | 12/2005 | Vadi | G06F 1/04 327/298 |
| 7,113,014 B1 | 9/2006 | Doyle | |
| 7,471,161 B2 | 12/2008 | Liu | |
| 7,622,978 B2 | 11/2009 | Tanaka | |
| 7,650,549 B2 | 1/2010 | Branch et al. | |
| 7,685,457 B2 | 3/2010 | Jacobson | |
| 7,969,185 B2 | 6/2011 | Ogawa | |
| 8,023,339 B2 | 9/2011 | Kim et al. | |
| 8,456,386 B2 * | 6/2013 | Shin | G09G 3/20 345/76 |
| 8,923,090 B1 * | 12/2014 | Evans | G11C 8/06 365/189.02 |

* cited by examiner

*Primary Examiner* — An Luu
(74) *Attorney, Agent, or Firm* — Amin, Turocy & Watson LLP (57) ABSTRACT

Various aspects provide for generating a clock signal for a hold latch. A latch pulse generator generates a pulse clock signal based on a first clock signal associated with a first flip-flop component and a second clock signal associated with a second flip-flop component. A hold latch component receives the pulse clock signal generated by the latch pulse generator and generates a data signal that is transmitted to the second flip-flop component.

20 Claims, 7 Drawing Sheets

GENERATING A PULSE CLOCK SIGNAL BASED ON A FIRST CLOCK SIGNAL AND A SECOND CLOCK SIGNAL

TECHNICAL FIELD

The subject disclosure relates generally to digital electronics, and more particularly to generating a clock signal for a digital device.

BACKGROUND

Timing is a critical aspect for proper operation of digital devices (e.g., memory elements, flip-flops, latches, etc.). For example, a clock can be employed to trigger a change of state for a digital device. Each clock event for a digital device (e.g., a memory element, a flip-flop, a latch, etc.) is generally associated with a setup time and a hold time (e.g., a timing window). Setup time is a minimum amount of time before a clock event that data input for a digital device is required to be stable (e.g., unchanged). Hold time is a minimum amount of time after a clock event that data input for a digital device is required to be stable (e.g., unchanged). As such, timing and/or pulse width of a clock for a digital device can greatly impact performance and/or accuracy of the digital device.

The above-described description is merely intended to provide a contextual overview of current digital electronic systems and is not intended to be exhaustive.

SUMMARY

The following presents a simplified summary in order to provide a basic understanding of some aspects described herein. This summary is not an extensive overview of the disclosed subject matter. It is intended to neither identify key nor critical elements of the disclosure nor delineate the scope thereof. Its sole purpose is to present some concepts in a simplified form as a prelude to the more detailed description that is presented later.

In an example embodiment, a system comprises a latch pulse generator and a hold latch component. The latch pulse generator is configured for generating a pulse clock signal based on a first clock signal associated with a first flip-flop component and a second clock signal associated with a second flip-flop component. The hold latch component is configured for receiving the pulse clock signal generated by the latch pulse generator and for generating a data signal that is transmitted to the second flip-flop component.

In another example embodiment, a method comprises receiving a first clock signal associated with a first flip-flop component, receiving a second clock signal associated with a second flip-flop component, and generating a pulse clock signal for a hold latch component as a function of the first clock signal and the second clock signal.

In yet another example embodiment, a system comprises means for receiving a first clock associated with a first flip-flop component, means for receiving a second clock associated with a second flip-flop component, and means for generating a clock signal for a latch component as a function of the first clock and the second clock.

The following description and the annexed drawings set forth in detail certain illustrative aspects of the subject disclosure. These aspects are indicative, however, of but a few of the various ways in which the principles of various disclosed aspects can be employed and the disclosure is intended to include all such aspects and their equivalents. Other advantages and novel features will become apparent from the following detailed description when considered in conjunction with the drawings.

DETAILED DESCRIPTION

The disclosure herein is described with reference to the drawings, wherein like reference numerals are used to refer to like elements throughout. In the following description, for purposes of explanation, numerous specific details are set forth in order to provide a thorough understanding of the subject innovation. It may be evident, however, that various disclosed aspects can be practiced without these specific details. In other instances, well-known structures and devices are shown in block diagram form in order to facilitate describing the subject innovation.

Various aspects of the present disclosure relate to generating a clock signal for a digital device (e.g., a latch). The clock signal for the digital device (e.g., the latch) can be configured to reduce impact of setup timing window closure and/or hold timing window closure (e.g., across synchronous interfaces). In an aspect, a pulse generator can be employed to generate a pulse clock signal for a latch (e.g., a hold latch). For example, the pulse generator can be a synchronous interface for the latch (e.g., the hold latch). The pulse generator can receive a first clock signal (e.g., a launch clock) and a second clock signal (e.g., a capture clock). The first clock signal can be associated with a first synchronous block (e.g., a first flip-flop component) and the second clock signal can be associated with a second synchronous block (e.g., a second flip-flop component). The pulse clock signal generated by the pulse generator can be a minimum pulse width required by a latch (e.g., a hold latch). Furthermore, the pulse clock signal can allow a latch (e.g., a hold latch) to open at an earliest falling edge of the pulse clock signal. As such, setup time can be improved (e.g., impact of setup timing window closure and/or hold timing window closure can be reduced). Moreover, setup paths can be optimized without being limited by hold violations. Accordingly, performance and/or accuracy of digital devices (e.g., latches) can be improved.

Figure 1:
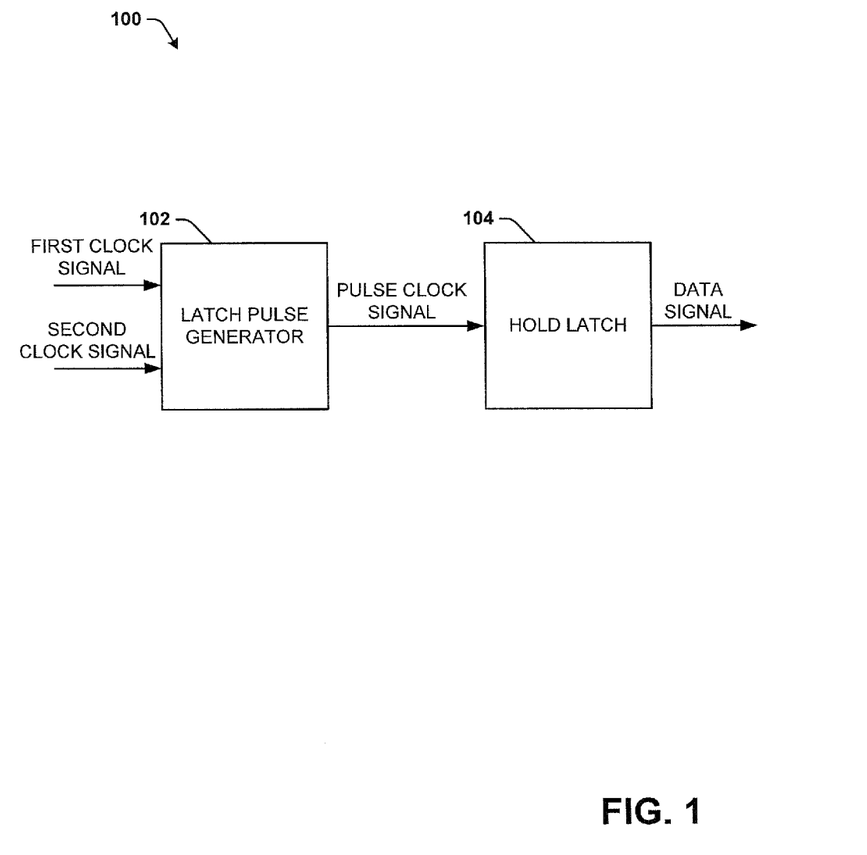
FIG. 1 is a block diagram illustrating an example, non-limiting embodiment of a system in accordance with various aspects described herein.

Turning now to FIG. 1, a block diagram illustrating an example, non-limiting embodiment of a system 100 in accordance with various aspects described herein is shown. In an aspect, the system 100 can be a digital electronic (e.g., a digital logic) system. System 100 includes a latch pulse generator 102 (e.g., a latch pulse generator component 102) and a hold latch 104 (e.g., a hold latch component 104). The latch pulse generator 102 can receive a first clock signal (e.g., FIRST CLOCK SIGNAL shown in FIG. 1) and a second clock signal (e.g., SECOND CLOCK SIGNAL shown in FIG. 1). The first clock signal and the second clock signal can be two clock domains that are synchronized. For example, the first clock signal can be a launch clock and the second clock signal can be a capture clock. In an aspect, the first clock signal can be associated with a first synchronous component (e.g., a first flip-flop component) and the second clock signal can be associated with a second synchronous component (e.g., a second flip-flop component). For example, the first synchronous component (e.g., the first flip-flop component) and the second synchronous component (e.g., the second flip-flop component) can be associated with (e.g., coupled to) the hold latch 104. In another aspect, the first clock signal and the second clock signal can be associated with a reference clock signal. For example, the first clock signal and the second clock signal can be generated based on a phase-locked loop that receives a reference clock signal.

The latch pulse generator 102 can generate a pulse clock signal (e.g., PULSE CLOCK SIGNAL shown in FIG. 1) as a function of the first clock signal and the second clock signal. The latch pulse generator 102 can be configured to control a minimum pulse width of the pulse clock signal based on the first clock signal and the second clock signal (e.g., values of the first clock signal and the second clock signal). For example, the pulse clock signal can comprise a minimum pulse width required by the hold latch 104. Furthermore, a value of the pulse clock signal can be greater than a mismatch between the first clock signal and the second clock signal. The latch pulse generator 102 can improve setup time (e.g., minimum amount of time before a clock transition of the pulse clock signal where data input must not change) of the hold latch 104.

The latch pulse generator 102 can be configured to process and/or modify the first clock signal and the second clock signal to generate the pulse clock signal. In an embodiment, the latch pulse generator 102 can comprise a first logic gate configured to generate a first signal based on the first clock signal and the second clock signal. The first signal can be received by a pulse width controller and a second logic gate. The pulse width controller can generate a modified first signal that is received by a third logic gate. Furthermore, the latch pulse generator 102 can comprise a set of transistors. The set of transistors can be configured to generate a second signal based on the first clock signal and the second clock signal. The second signal can be received by a set of inverters. The set of inverters can be configured to store the second signal for a period of time. The third logic gate can be configured to generate a control signal based on the modified first signal and the second signal. As such, the second logic gate can be configured to generate the pulse clock signal based on the control signal and the first signal.

The latch pulse generator 102 can be configured as a synchronous interface for the hold latch 104. The pulse clock signal generated by the latch pulse generator 102 can be received by the hold latch 104. For example, the pulse clock signal can be a clock for the hold latch 104. The hold latch 104 can be configured as a storage component (e.g., a data hold latch). For example, the hold latch 104 can store data (e.g., a single bit) when the pulse clock signal is low (e.g., when the pulse clock signal is in a low state). However, it is to be appreciated that the hold latch 104 can be configured as a different type of latch device (e.g., the hold latch 104 can store data when the pulse clock signal is high, etc.). The hold latch 104 can be configured to generate a data signal (e.g., DATA SIGNAL shown in FIG. 1) as a function of the pulse clock signal. For example, the data signal generated by the hold latch 104 can be transmitted to a synchronous component (e.g., the second flip-flop component, a capture flip-flop, a storage register, etc.).

Figure 2:
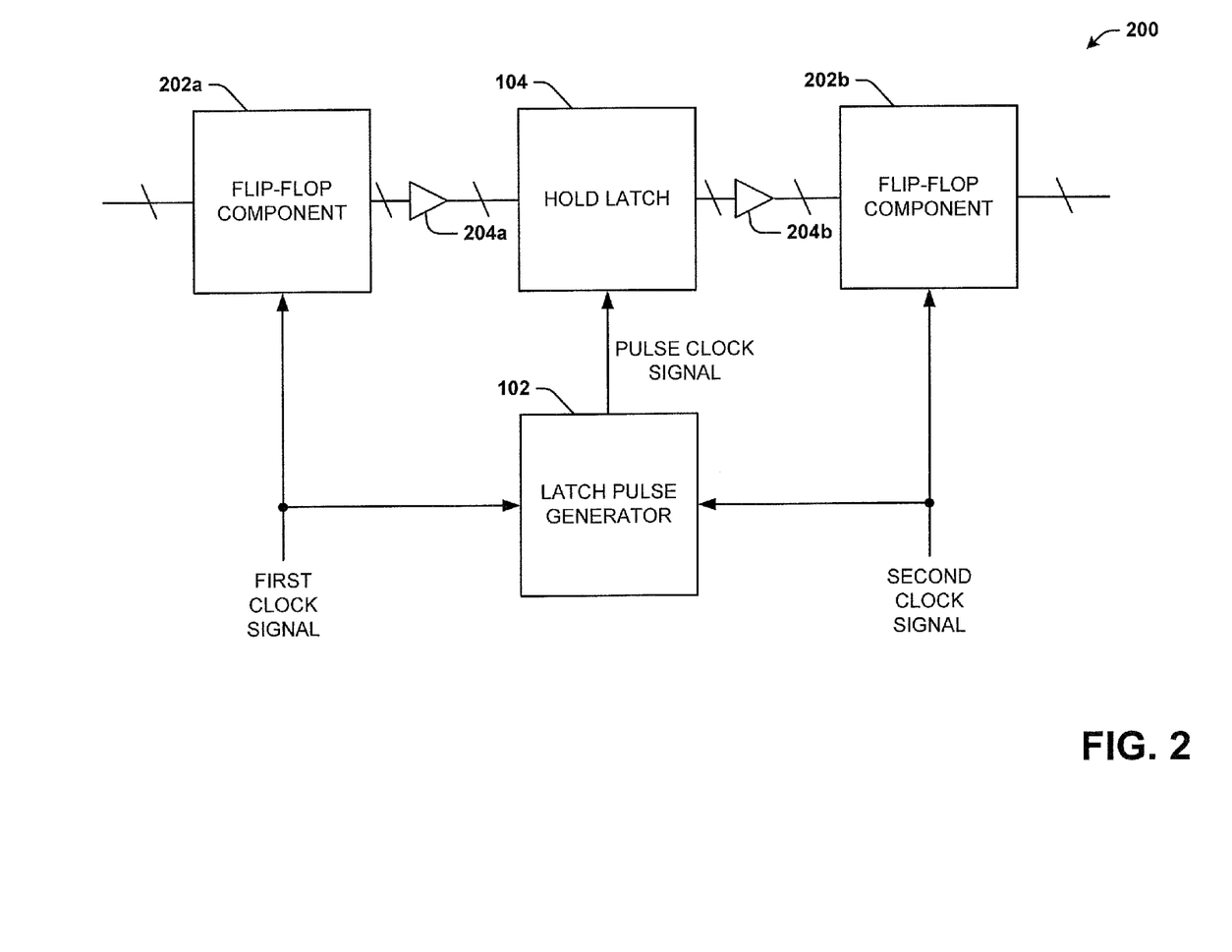
FIG. 2 is a block diagram illustrating another example, non-limiting embodiment of a system in accordance with various aspects described herein.

Referring to FIG. 2, a block diagram illustrating an example, non-limiting embodiment of a system 200 in accordance with various aspects described herein is shown. In an aspect, the system 200 can be a digital electronic (e.g., a digital logic) system. System 200 includes the latch pulse generator 102 (e.g., the latch pulse generator component 102), the hold latch 104 (e.g., the hold latch component 104) and at least a flip-flop component 202a and a flip-flop component 202b. In an embodiment, the system 200 can further include at least an amplifier 204a and an amplifier 204b.

The flip-flop component 202a and the flip-flop component 202b can be clocked devices. Furthermore, the flip-flop component 202a and the flip-flop component 202b can be synchronous elements. In an aspect, the flip-flop component 202a can be a first flip-flop storage register and the flip-flop component 202b can be a second flip-flop storage register. The flip-flop component 202a can receive the first clock signal and the flip-flop component 202b can receive the second clock signal. As such, the first clock signal can be received by the latch pulse generator 102 and the flip-flop component 202a. Furthermore, the second clock signal can be received by the latch pulse generator 102 and the flip-flop component 202b. The flip-flop component 202a and the flip-flop component 202b can be coupled to the hold latch 104. For example, an output of the flip-flop component 202a can be coupled to the hold latch 104 and an input of the flip-flop component 202b can be coupled to the hold latch 104. In an embodiment, the amplifier 204a can be configured between the flip-flop component 202a and the hold latch 104 (e.g., the amplifier 204a can modify output of the flip-flop component 202a). Furthermore, the amplifier 204b can be configured between the flip-flop component 202b and the hold latch 104 (e.g., the amplifier 204b can modify input of the flip-flop component 202b).

In an aspect the first clock signal can be a launch clock and the second clock signal can be a capture clock. For example, the flip-flop component 202a can be implemented as a launch flip-flop and the flip-flop component 202b can be implemented as a capture flip-flop. As such, the first clock signal (e.g., the launch clock) can facilitate launching of data at the flip-flop component 202a (e.g., the launch flip-flop) and the second clock signal (e.g., the capture clock) can facilitate capturing data at the flip-flop component 202b (e.g., the capture flip-flop).

Figure 3:
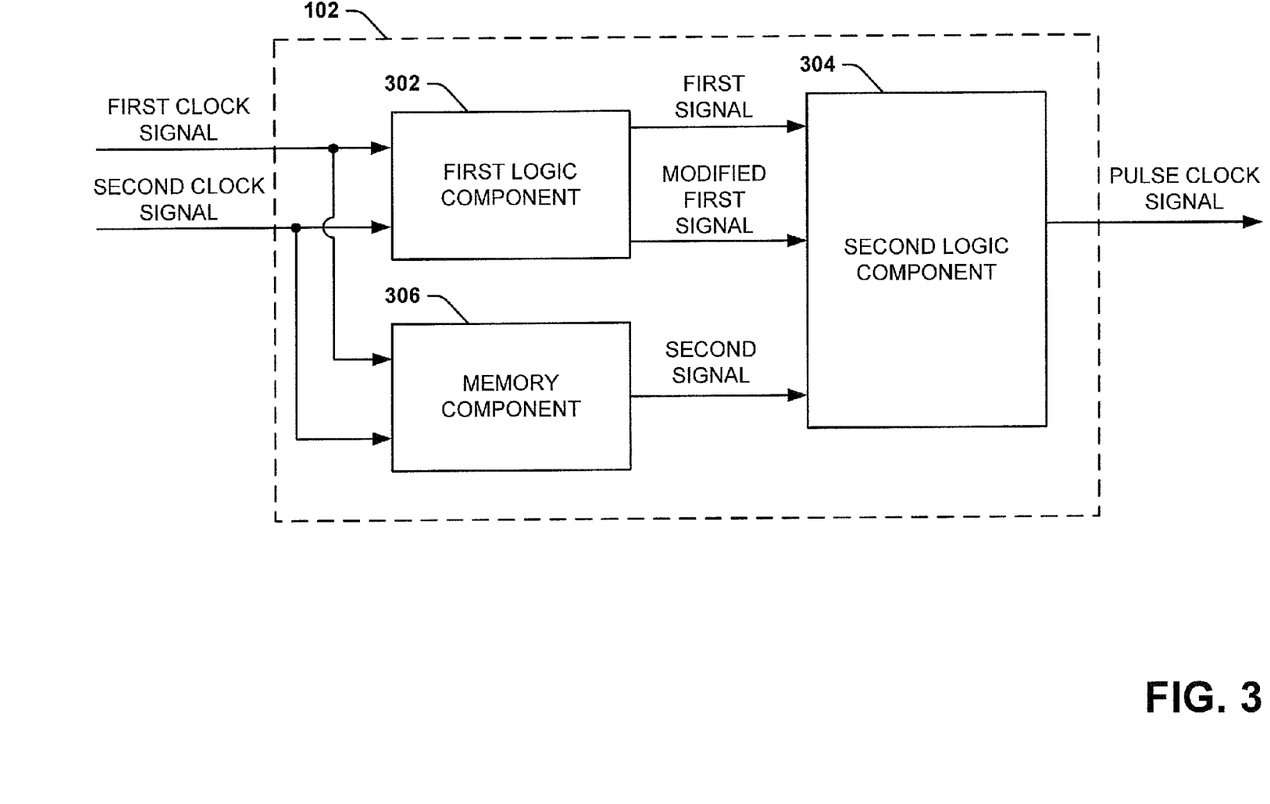
FIG. 3 is a block diagram illustrating an example, non-limiting embodiment of a latch pulse generator in accordance with various aspects described herein.

Referring now to FIG. 3, a block diagram illustrating an example, non-limiting embodiment of the latch pulse generator 102 (e.g., the latch pulse generator component 102) in accordance with various aspects described herein is shown. The latch pulse generator 102 includes a first logic component 302, a second logic component 304 and a memory component 306.

The first logic component 302 can receive the first clock signal and the second clock signal. The first logic component 302 can be configured for combinational logic and pulse width control. For example, combinational logic of the first logic component 302 can generate a first signal (e.g., FIRST SIGNAL shown in FIG. 3) based on the first clock signal and the second clock signal. The first signal can be received by the second logic component 304 and the pulse width control of the first logic component 302. The pulse width control of the first logic component 302 can modify (e.g., amplify and/or invert) the first signal to generate a modified first signal (e.g., MODIFIED FIRST SIGNAL shown in FIG. 3). Furthermore, the pulse width control of the first logic component 302 can facilitate control of a pulse width and/or strength of a pulse for the pulse clock signal.

Additionally, the memory component 306 can receive the first clock signal and the second clock signal. As such, the first clock signal and the second clock signal can be processed via a first data path (e.g., the first logic component 302) and a second data path (e.g., the memory component 306). The memory component 306 can include one or more pull-up devices and/or one or more pull-down devices (e.g., a pull-up network and/or a pull-down network) to produce a logical "1" value or a logical "0" value (e.g., a high value or a low value) based on the first clock signal and the second clock signal. In an aspect, the one or more pull-up devices and/or one or more pull-down devices can be implemented as a complementary metal-oxide-semiconductor (CMOS) transistor. For example, the one or more pull-up devices can be associated with a set of p-channel metal-oxide-semiconductor (PMOS) transistors and the one or more pull-down devices can be associated with a set of n-channel metal-oxide-semiconductor (NMOS) transistors. The memory component 306 can generate a second signal (e.g., SECOND SIGNAL shown in FIG. 3) based on the first clock signal and the second clock signal. In an aspect, the memory component 306 can store the second signal (e.g., the second signal generated based on the first clock signal and the second clock signal) for a certain period of time. As such, a value of the second signal received by the second logic component 304 can be delayed by a certain period of time.

The second logic component 304 can receive the first signal, the modified first signal and the second signal. The second logic component 304 can be configured for combinational logic. For example, the second logic component 304 can include a first type of combinational logic and/or a second type of combinational logic that can facilitate generation of the pulse clock signal. In an aspect, a first type of combinational logic of the second logic component 304 can generate a signal (e.g., a control signal) based on the modified first signal and the second signal. The second type of combinational logic of the second logic component 304 can generate the pulse clock signal based on the first signal and the signal (e.g., the control signal) generated by the first type of combinational logic of the second logic component 304. Accordingly, the latch pulse generator 102 can process, modify and/or combine the first clock signal and the second clock signal to generate the pulse clock signal.

Figure 4:
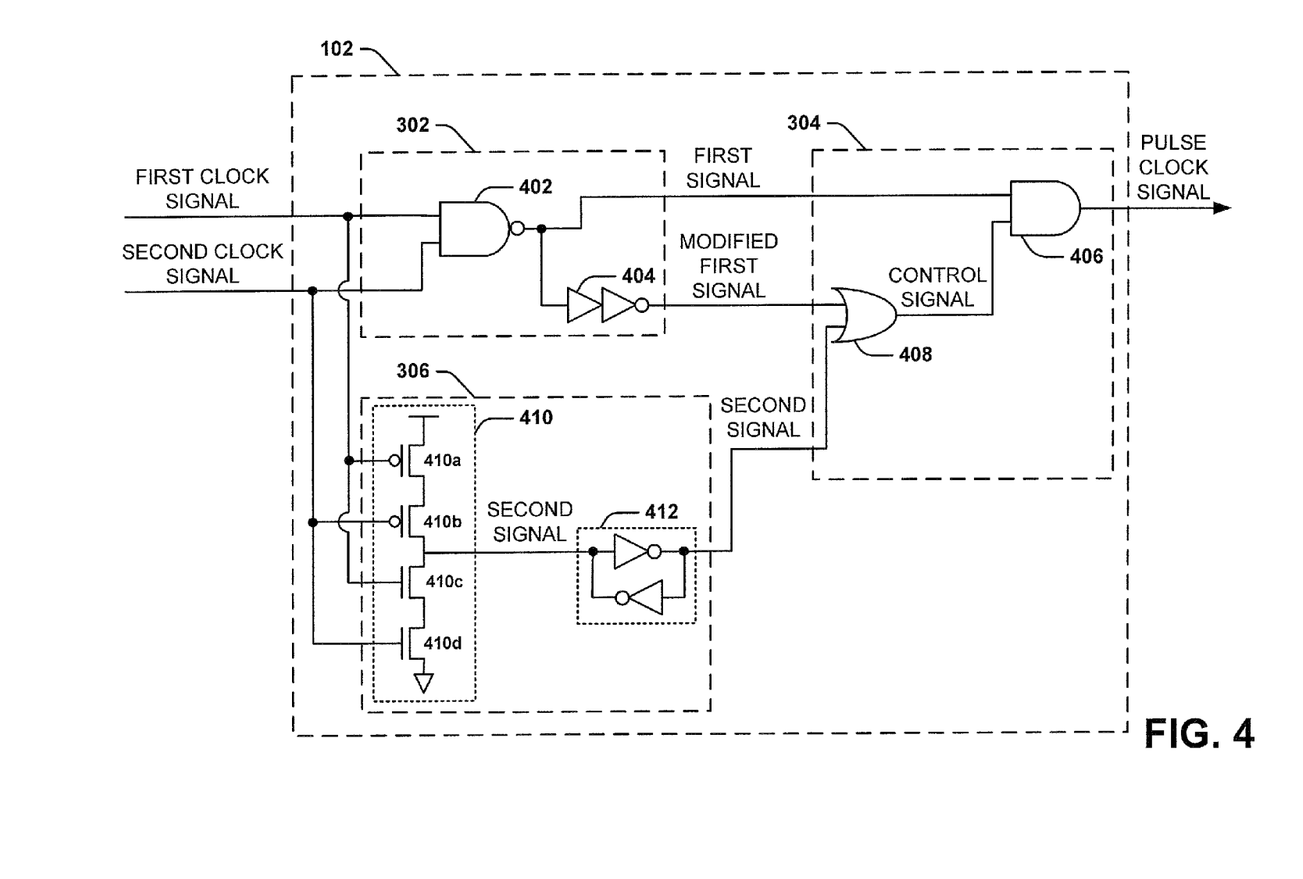
FIG. 4 is a block diagram illustrating another example, non-limiting embodiment of a latch pulse generator in accordance with various aspects described herein.

Referring now to FIG. 4, a block diagram illustrating another example, non-limiting embodiment of the latch pulse generator 102 in accordance with various aspects described herein is shown. The latch pulse generator 102 includes the first logic component 302, the second logic component 304 and the memory component 306. The first logic component 302 includes a first logic gate 402 and a pulse width controller 404 (e.g., a minimum pulse width control 404). The second logic component includes a second logic gate 406 and a third logic gate 408. The memory component 306 includes a set of transistors 410 and a set of inverters 412.

The first logic gate 402 can receive the first clock signal and the second clock signal. Additionally, the first logic gate 402 can generate the first signal as a function of the first clock signal and the second clock signal. In one example, the first logic gate 402 can be a NAND logic gate (e.g., a NAND combinational logic gate). The first logic gate 402 can be configured to generate a binary value (e.g., a logical "1" value or a logical "0" value) based on values of the first clock signal and the second clock signal. For example, in response to a determination that the first clock signal and the second clock signal are equal to a logical "1" value (e.g., a high value), the first logic gate 402 can generate a logical "0" value (e.g., a low value). Otherwise, the first logic gate 402 can generate a logical "1" value (e.g., a high value). The first signal generated by the first logic gate 402 can be received by the pulse width controller 404 and the second logic gate 406. The pulse width controller 404 can modify (e.g., amplify and/or invert) the first signal to generate the modified first signal.

Additionally, the set of transistors 410 can receive the first clock signal and the second clock signal. The set of transistors 410 can be configured as pull-up devices and pull-down devices. For example, the set of transistors 410 can include a set of PMOS transistors (e.g., transistor 410a and transistor 410b) associated with a pull-up network and a set of NMOS transistors (e.g., transistor 410c and transistor 410d) associated with a pull-down network. In the non-limiting example shown in FIG. 4, the transistor 410a can receive the first clock signal, the transistor 410b can receive the second clock signal, the transistor 410c can receive the first clock signal and the transistor 410d can receive the second clock signal. The set of transistors 410 can be configured to generate a binary value (e.g., a logical "1" value or a logical "0" value) based on values of the first clock signal and the second clock signal. For example, the set of transistors 410 can generate the second signal based on the first clock signal and the second clock signal. The second signal can be received by a set of inverters 412. The set of inverters 412 can be configured as a register (e.g., a 1-bit register). For example, the set of inverters 412 can store a value of the second signal for a certain period of time (e.g., the set of inverters 412 can preserve a charge of the second signal). As such, a value of the second signal received by the third logic gate 408 can be delayed by a certain period of time.

The third logic gate 408 can receive the modified first signal and the second signal. Additionally, the third logic gate 408 can generate a control signal (e.g., CONTROL SIGNAL shown in FIG. 4) as a function of the modified first signal and the second signal. In one example, the third logic gate 408 can be an OR logic gate (e.g., an OR combinational logic gate). The third logic gate 408 can be configured to generate a binary value (e.g., a logical "1" value or a logical "0" value) based on values of the modified first signal and the second signal. For example, in response to a determination that the modified first signal and the second signal are equal to a logical "0" value (e.g., a low value), the third logic gate 408 can generate a logical "0" value (e.g., a low value). Otherwise, the first logic gate 402 can generate a logical "1" value (e.g., a high value).

The second logic gate 406 can receive the first signal and the control signal. Additionally, the second logic gate 406 can generate the pulse clock signal based on the first signal and the control signal. In one example, the second logic gate 406 can be an AND logic gate (e.g., an AND combinational logic gate). For example, in response to a determination that the first signal is equal to a logical "1" value (e.g., a high value) and the control signal is equal to a logical "0" value (e.g., a low value), the second logic gate 406 can generate a logical "1" value (e.g., a high value). Otherwise, the second logic gate 406 can generate a logical "0" value (e.g., a low value). As such, the pulse clock signal generated by the latch pulse generator 102 can comprise a minimum pulse width required by the hold latch 104. Accordingly, performance and/or accuracy of the hold latch 104 can be improved.

Figure 5:
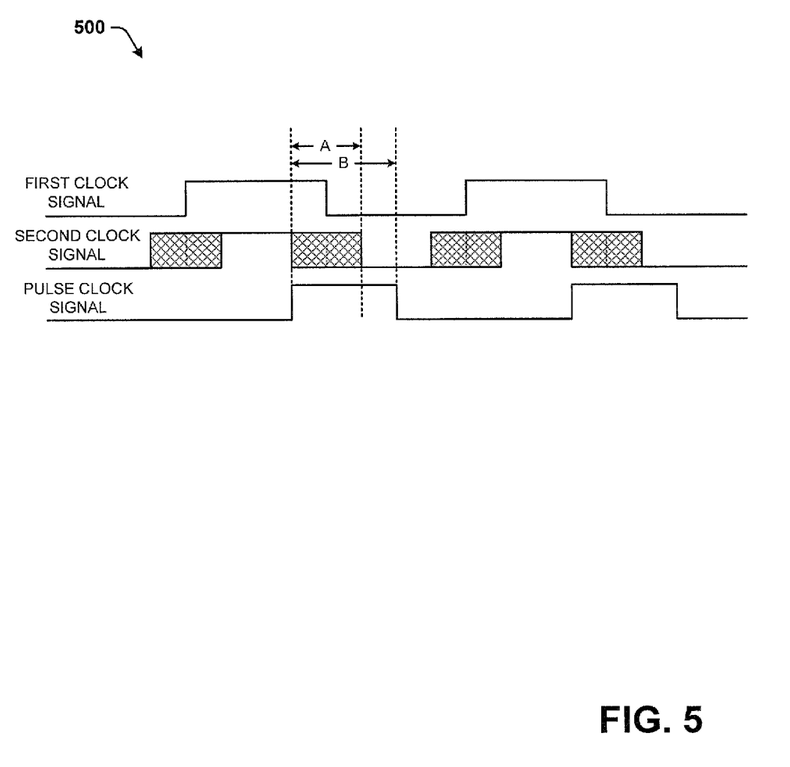
FIG. 5 is a diagram illustrating a non-limiting example of a pulse clock signal generated based on a first clock signal and a second clock signal in accordance with various aspects described herein.

Referring now to FIG. 5, a diagram 500 illustrating a non-limiting example of a first clock signal, a second clock signal and a pulse clock signal in accordance with various aspects described herein is shown. In an example, the first clock signal can be a launch clock (e.g., associated with the flip-flop component 202a) and the second clock signal can be a capture clock (e.g., associated with the flip-flop component 202b). The pulse clock signal can be generated by the latch pulse generator 102. In FIG. 5, time range A corresponds to delta (e.g., delta time) in clock delays. Furthermore, in FIG. 5, time range B corresponds to a delay line (e.g., delay line time) to guarantee a minimum pulse width. The pulse clock signal can be a minimum pulse width required by a latch (e.g., the hold latch 104). Furthermore, the pulse clock signal can allow a latch (e.g., the hold latch 104) to open (e.g., receive data input) at an earliest falling edge to improve setup time (e.g., to reduce impact of setup timing window closure and/or hold timing window closure). As such, data input can be captured by a latch (e.g., the hold latch 104) while reducing impact of hold time and/or improving data accuracy.

Figure 6:
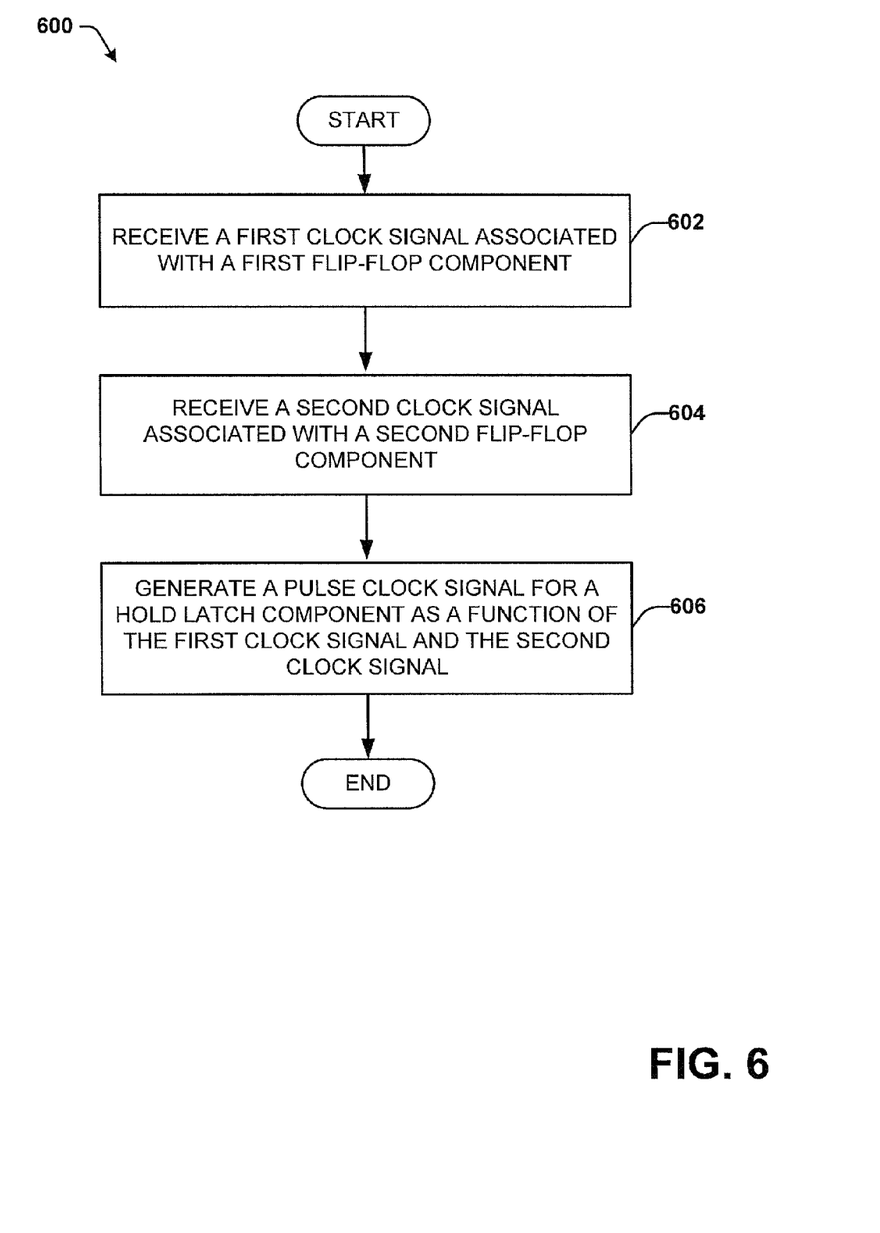
FIG. 6 illustrates a flow diagram of an example, non-limiting embodiment of a method for generating a clock signal for a hold latch.
Figure 7:
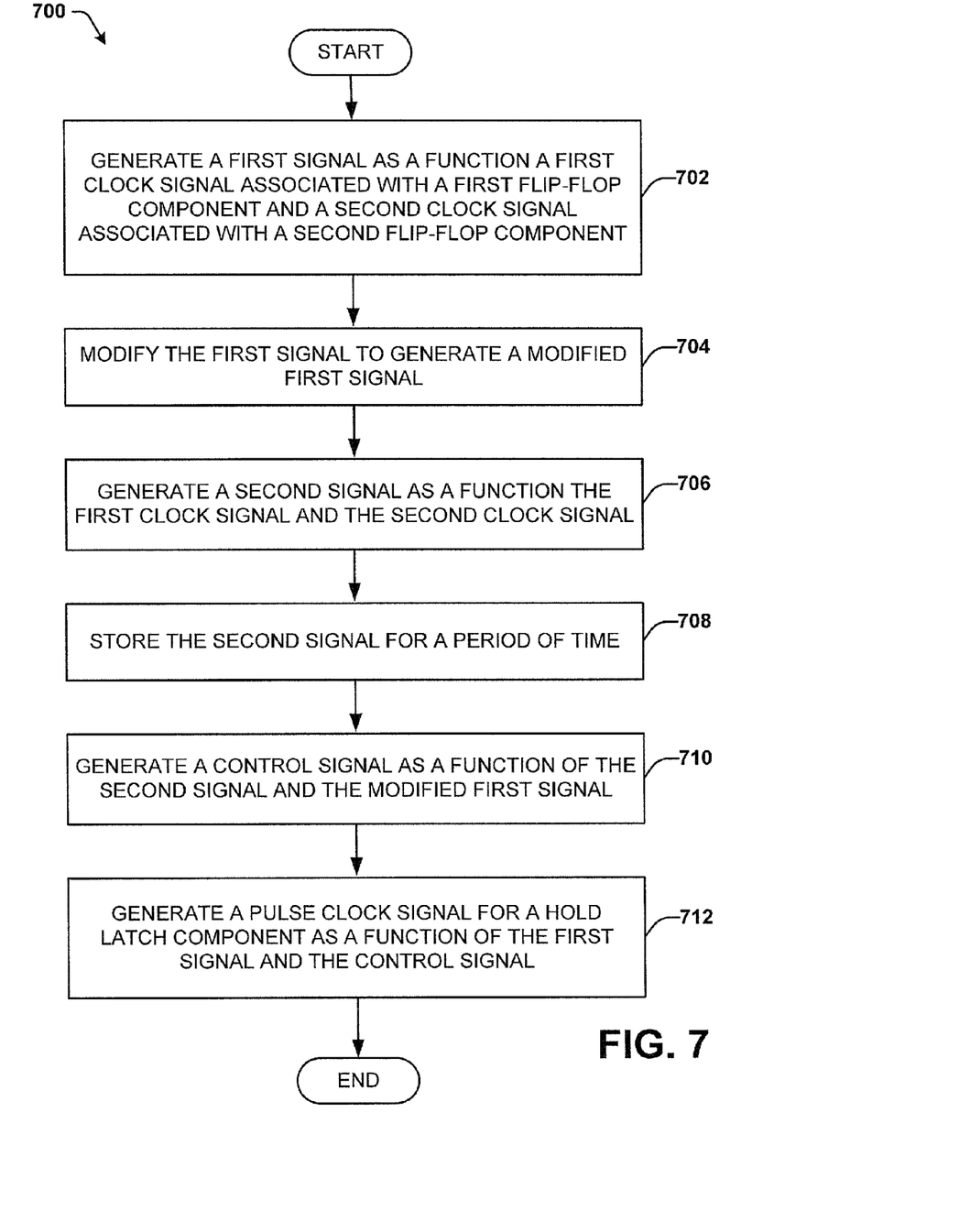
FIG. 7 illustrates a flow diagram of another example, non-limiting embodiment of a method for generating a clock signal for a hold latch.

In view of the example systems described above, methods that may be implemented in accordance with the described subject matter may be better appreciated with reference to the flow charts of FIGS. 6-7. While for purposes of simplicity of explanation, the methods are shown and described as a series of blocks, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methods described hereinafter.

Referring now to FIG. 6, a flow diagram of an example, non-limiting embodiment of a method for generating a clock signal for a hold latch is shown. Method 600 can begin at block 602, where a first clock signal associated with a first flip-flop component is received (e.g., by a latch pulse generator 102). For example, the first clock signal can be a launch clock associated with the first flip-flop component. As such, the first clock signal (e.g., the launch clock) can facilitate launching of data at the first flip-flop component.

At block 604, a second clock signal associated with a second flip-flop component is received (e.g., by a latch pulse generator 102). For example, the second clock signal can be a capture clock associated with the second flip-flop component. As such, the second clock signal (e.g., the capture clock) can facilitate capturing data at the second flip-flop component.

At block 606, a pulse clock signal for a hold latch component is generated (e.g., by a latch pulse generator 102) as a function of the first clock signal and the second clock signal. For example, the hold latch component can be associated with (e.g., coupled to) the first flip-flop component and the second flip-flop component. The pulse clock signal can be configured with a minimum pulse width required by the hold latch component.

Referring now to FIG. 7, a flow diagram of another example, non-limiting embodiment of a method for generating a clock signal for a hold latch is shown. Method 700 can begin at block 702, where a first signal is generated (e.g., by a latch pulse generator 102) as a function a first clock signal associated with a first flip-flop component and a second clock signal associated with a second flip-flop component. For example, the first signal can be generated via a first logic gate (e.g., a NAND gate).

At block 704, the first signal is modified (e.g., by a latch pulse generator 102) to generate a modified first signal. For example, the first signal can be modified (e.g., amplified and/or inverted) by a pulse width controller (e.g., minimum pulse width control).

At block 706, a second signal is generated (e.g., by a latch pulse generator 102) as a function the first clock signal and the second clock signal. For example, the second signal can be generated via a set of transistors (e.g., one or more pull-up devices and/or one or more pull-down devices).

At block 708, the second signal is stored (e.g., by a latch pulse generator 102) for a period of time. For example, the second signal can be stored for a period of time via a set of inverters.

At block 710, a control signal is generated (e.g., by a latch pulse generator 102) as a function of the second signal and the modified first signal. For example, the control signal can be generated via a second logic gate (e.g., an OR gate).

At block 712, a pulse clock signal for a hold latch component is generated (e.g., by a latch pulse generator 102) as a function of the first signal and the control signal. For example, the pulse clock signal can be generated via a third logic gate (e.g., an AND gate). Accordingly, a pulse clock signal that includes a minimum pulse width required by the hold latch component can be generated.

Reference throughout this specification to "one embodiment," "an embodiment," "an example", "a disclosed aspect," or "an aspect" means that a particular feature, structure, or characteristic described in connection with the embodiment or aspect is included in at least one embodiment or aspect of the present disclosure. Thus, the appearances of the phrase "in one embodiment," "in one example," "in one aspect," or "in an embodiment," in various places throughout this specification are not necessarily all referring to the same embodiment. Furthermore, the particular features, structures, or characteristics may be combined in any suitable manner in various disclosed embodiments.

As utilized herein, terms "component," "system," "architecture," "engine" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, . . . ) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, or the like. Of course, those skilled in the art will recognize many modifications can be made to this configuration without departing from the scope or spirit of the disclosed subject matter.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, calculating, determining, or displaying, and the like, refer to the action and processes of processing systems, and/or similar consumer or industrial electronic devices or machines, that manipulate or transform data represented as physical (electrical and/or electronic) quantities within the registers or memories of the electronic device(s), into other data similarly represented as physical quantities within the machine and/or computer system memories or registers or other such information storage, transmission and/or display devices.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

What is claimed is:

1. A system, comprising:
   a latch pulse generator configured for generating a pulse clock signal based on a first clock signal associated with a first flip-flop component and a second clock signal associated with a second flip-flop component; and
   a hold latch component configured for receiving the pulse clock signal generated by the latch pulse generator and for generating a data signal that is transmitted to the second flip-flop component.

2. The system of claim 1, wherein the latch pulse generator comprises a first logic gate configured for generating a signal based on the first clock signal and the second clock signal.

3. The system of claim 2, wherein the signal is received by a pulse width controller and a second logic gate configured for generating the pulse clock signal.

4. The system of claim 2, wherein the latch pulse generator comprises a pulse width controller that modifies the signal generated by the first logic gate.

5. The system of claim 1, wherein the latch pulse generator further comprises a set of transistors for generating a signal based on the first clock signal and the second clock signal.

6. The system of claim 5, wherein the signal is received by a set of inverters configured for storing the signal for a period of time.

7. The system of claim 1, wherein the latch pulse generator comprises a first logic gate configured for generating a control signal based on a first signal generated by a pulse width controller and a second signal received from a set of inverters.

8. The system of claim 7, wherein the latch pulse generator comprises a second logic gate configured for generating the pulse clock signal based on the control signal and a signal generated based on the first clock signal and the second clock signal.

9. The system of claim 1, wherein the pulse clock signal comprises a minimum pulse width for the hold latch component.

10. The system of claim 1, wherein the first clock signal is a launch clock for the first flip-flop component.

11. The system of claim 1, wherein the second clock signal is a capture clock for the second flip-flop component.

12. A method, comprising:
  receiving a first clock signal associated with a first flip-flop component;
  receiving a second clock signal associated with a second flip-flop component;
  generating a pulse clock signal as a function of the first clock signal and the second clock signal;
  generating a data signal based on the pulse clock signal; and
  transmitting the data signal to the second flip-flop component.

13. The method of claim 12, further comprising:
  generating a signal as a function the first clock signal and the second clock signal via a logic gate.

14. The method of claim 13, further comprising:
  modifying the signal via a pulse width controller.

15. The method of claim 12, further comprising:
  generating a signal as a function the first clock signal and the second clock signal via a set of transistors.

16. The method of claim 15, further comprising:
  storing the signal generated via the set of transistors for a period of time.

17. The method of claim 12, further comprising:
  generating a control signal as a function of a first signal generated by a pulse width controller and a second signal received from a set of inverters.

18. The method of claim 17, wherein the generating the pulse clock signal comprises generating the pulse clock signal as a function of the control signal and a signal generated as a function of the first clock signal and the second clock signal.

19. The method of claim 12, wherein the generating the pulse clock signal comprises generating the pulse clock signal via a logic gate.

20. An integrated circuit chip comprising a synchronous interface, comprising:
  a latch pulse generator configured for generating a pulse clock signal based on a first clock signal associated with a first flip-flop component and a second clock signal associated with a second flip-flop component; and
  a hold latch component configured for receiving the pulse clock signal generated by the latch pulse generator and for generating a data signal that is transmitted to the second flip-flop component.

* * * * *